US012660570B2

(12) United States Patent
Ling et al.

(10) Patent No.: US 12,660,570 B2
(45) Date of Patent: Jun. 16, 2026

(54) LUMINESCENCE METHOD FOR THE IN-LINE DETECTION OF ATOMIC SCALE DEFECTS DURING FABRICATION OF 4H—SiC DIODES

(71) Applicant: THE UNIVERSITY OF HONG KONG, Hong Kong (CN)

(72) Inventors: Chi Chung Francis Ling, Hong Kong (CN); Sihua Li, Hong Kong (CN); Lok Ping Ho, Hong Kong (CN); Wing Chong Tony Chau, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 335 days.

(21) Appl. No.: 18/481,792

(22) Filed: Oct. 5, 2023

(65) Prior Publication Data

US 2024/0128129 A1 Apr. 18, 2024

Related U.S. Application Data

(60) Provisional application No. 63/415,516, filed on Oct. 12, 2022.

(51) Int. Cl.
H10P 74/20 (2026.01)
H01J 37/28 (2006.01)
(Continued)

(52) U.S. Cl.
CPC ............ H10P 74/203 (2026.01); H01J 37/28 (2013.01); H01J 37/285 (2013.01);
(Continued)

(58) Field of Classification Search
CPC ........ H01J 37/26; H01J 37/222; H01J 37/244; H01J 2237/2445; H01J 2237/2448; H01J 2237/24585; H01J 37/22; G01N 23/2251
See application file for complete search history.

(56) References Cited

U.S. PATENT DOCUMENTS 3,790,781 A * 2/1974 Horl ...................... H01J 37/228
250/491.1
6,028,977 A * 2/2000 Newsome ............... G02F 1/011
313/498

(Continued)

FOREIGN PATENT DOCUMENTS

CN 109979793 A * 7/2019 .............. H01J 37/22
CN 116802765 A * 9/2023 ............ H01J 37/228
(Continued)

OTHER PUBLICATIONS

A. Kakanakova-Georgieva, R. Yakimova, M. "Site-occupying behavior of boron in compensated p-type 4H—SiC grown by sublimation epitaxy", Journal of Applied Physics 91, 3471 (2002); doi: 10.1063/1.1433931 (Year: 2002).*

(Continued)

*Primary Examiner* — David A Vanore
(74) *Attorney, Agent, or Firm* — Leason Ellis LLP

(57) ABSTRACT

A method of detecting atomic scale defects in semiconductors, comprising the steps of scanning the surface of the semiconductor with a field emission scanning electron microscope (SEM) to form an SEM image thereof; scanning the SEM image with a light detector and monochromator to obtain a cathodoluminescence (CL) spatial intensity map of the SEM image; determining the CL spectra, i.e. the CL intensity against photon energy for each integral CL intensity; and comparing the CL intensity to a threshold, whereby those semiconductors whose CL intensity is above the threshold are deemed to be defective.

5 Claims, 3 Drawing Sheets
(3 of 3 Drawing Sheet(s) Filed in Color)

(51) Int. Cl.

| | |
|---|---|
| *H01J 37/285* | (2006.01) |
| *H10D 8/01* | (2025.01) |
| *H10D 62/83* | (2025.01) |
| *H10D 62/832* | (2025.01) |

(52) U.S. Cl.

CPC ................ *H01J 2237/24507* (2013.01); *H01J 2237/24564* (2013.01); *H01J 2237/2808* (2013.01); *H01J 2237/2812* (2013.01); *H01J 2237/2817* (2013.01); *H10D 8/051* (2025.01); *H10D 62/8303* (2025.01); *H10D 62/8325* (2025.01)

(56) References Cited

U.S. PATENT DOCUMENTS

| | | | | |
|---|---|---|---|---|
| 8,933,402 | B2 * | 1/2015 | Shimizu | H01L 22/12 |
| | | | | 250/311 |
| 10,018,579 | B1 * | 7/2018 | Shriyan | G01N 23/2254 |
| 11,955,310 | B2 * | 4/2024 | Tiemeijer | H01J 37/26 |
| 11,992,350 | B2 * | 5/2024 | Yun | G01N 23/044 |
| 2003/0030067 | A1 * | 2/2003 | Chen | C09K 11/7702 |
| | | | | 257/E33.002 |
| 2007/0023655 | A1 * | 2/2007 | Nishikata | H01J 37/244 |
| | | | | 250/310 |
| 2013/0068966 | A1 * | 3/2013 | Kociak | H01J 37/244 |
| | | | | 250/458.1 |
| 2014/0131573 | A1 * | 5/2014 | Parker | H01J 37/228 |
| | | | | 250/307 |
| 2014/0131574 | A1 * | 5/2014 | Zewail | H01J 37/073 |
| | | | | 250/311 |
| 2014/0339438 | A1 * | 11/2014 | Correns | G01N 23/2254 |
| | | | | 250/459.1 |
| 2022/0020559 | A1 * | 1/2022 | Monachon | H01J 37/045 |
| 2022/0178854 | A1 * | 6/2022 | Fouchier | G01N 23/2254 |
| 2022/0230841 | A1 * | 7/2022 | Davies | H01J 37/228 |
| 2024/0153736 | A1 * | 5/2024 | Sannomiya | H01J 37/26 |

FOREIGN PATENT DOCUMENTS

| | | | | |
|---|---|---|---|---|
| EP | 2690647 | A1 * | 1/2014 | ........... H01J 37/226 |
| EP | 4027133 | A1 * | 7/2022 | ......... G01N 21/6408 |
| WO | WO-2020225453 | A3 * | 12/2020 | ......... H01J 37/1474 |
| WO | WO-2022118294 | A1 * | 6/2022 | ........... H01J 37/228 |

OTHER PUBLICATIONS

Ayedh, H.M., et al., "Carbon vacancy control in p+-n silicon carbide diodes for high voltage bipolar applications," Journal of Physics D: Applied Physics 54, 2021, 6 pages.

S. I. Maximenko et al, "Cathodoluminescence study of the properties of stacking faults in 4H—SiC homoepitaxial layers." Appl. Physi. Lett. 94, 092101 (2009), 4 pages.

F. Fabbri et al, "Comparison between cathodolumescence spectroscopy and capacitance transient spectroscopy on Al + ion implanted 4H—SiC p+/n diodes," Superlattice and Microstructures, 45, (2009) pp. 383-387.

T. Katsuno et al., "Effects of Surface and Crystalline Defects on Reverse Characteristics of 4H—SiC Junction Barrier Schottky Diodes," Jpn. J. Appl. Phys., 50, 04DP04 (2011), p. 04DP04-1-04DP04-4.

M. L. Megherbi et al., "Analysis of trapping effects on the forward current-voltage characteristics of Al-implanted 4H—SiC p-i-n diodes," IEEE Trans. 65, 3371 (2018), pp. 3371-3377.

S. Tumakha et al., "Defect-driven inhomogeneities in Ni/4H—SiC Schottky barriers," Applied Physics Letters, vol. 87, 242106 (2005), 5 pages.

Son, N.T., et al., "Negative-U system of carbon vacancy in 4H—SiC," Phys Rev Lett, 2012. 109(18): p. 187603, pp. 187603-1-187603-5.

H M Ayedh., et al., "Carbon vacancy control in p+-n silicon carbide diodes for high voltage bipolar applications," Journal of Physics D: Applied Physics, 2021. 54(45), 6 pages.

Grandidier, B., et al., "Defect-assisted tunneling current: A revised interpretation of scanning tunneling spectroscopy measurements," Applied Physics Letters, 2000, 76(21): pp. 3142-3144.

Mandurrino, M., et al., "Physics-based modeling and experimental implications of trap-assisted tunneling in InGaN/GaN light-emitting diodes," Physica Status Solidi (a), 2015, 212(5): pp. 947-953.

* cited by examiner

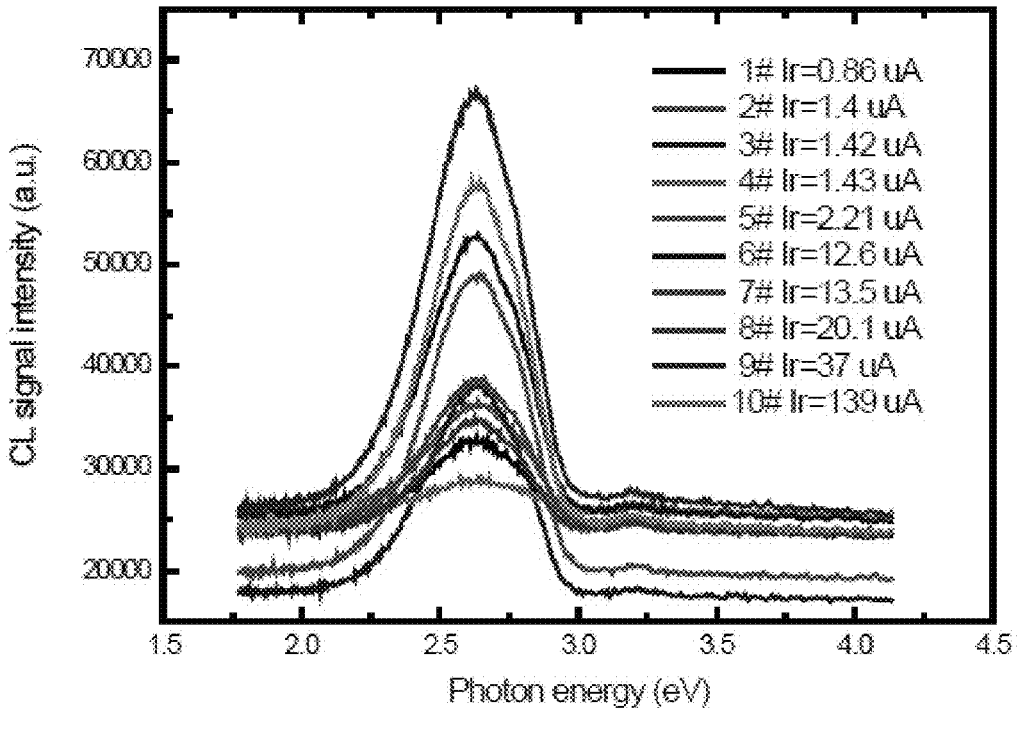
FIG. 2
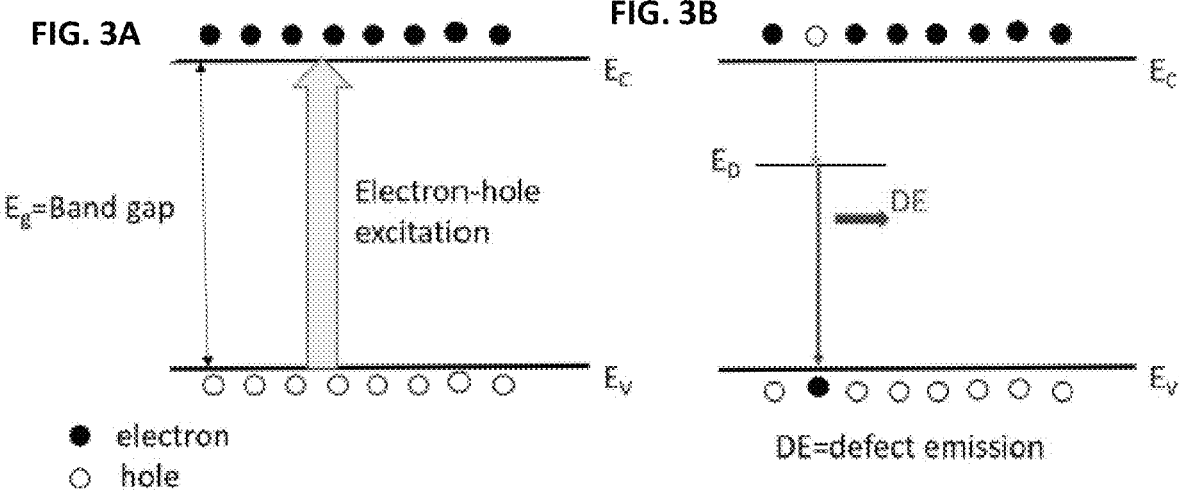

LUMINESCENCE METHOD FOR THE IN-LINE DETECTION OF ATOMIC SCALE DEFECTS DURING FABRICATION OF 4H—SiC DIODES

CROSS-REFERENCE TO RELATED PATENT APPLICATIONS

This application claims the benefit of priority under 35 U.S.C. Section 119(e) of U.S. Application No. 63/415,516 filed Oct. 12, 2022, which is incorporated herein by reference in its entirety.

FIELD OF THE INVENTION

The present invention relates to the detection of atomic scale defects during semiconductor fabrication and, in particular, to a luminescence method for in-line detection of atomic scale defects during fabrication of 4H-SiC diodes.

BACKGROUND OF THE INVENTION

4H-SiC is a wide band gap semiconductor that has proven to be very promising for the fabrication of high power devices used in various applications like electrical vehicles and power invertors. Atomic scale defects like vacancies and anti-sites of carbon and silicon having electronic states in the band gap are electrically active and have a large influence on the electrical properties of the materials and devices. Atomic scale intrinsic defects exist in as-grown SiC epitaxial growth (epi) material. For example, carbon vacancy $V_C$ is the dominant atomic scale defect in 4H-SiC. These defects have concentrations of ~$5\times10^{12}$ cm$^{-3}$ in state-of-the-art 4H-SiC epi wafers. Ayedh, H. M., et al., "Carbon vacancy control in p+-n silicon carbide diodes for high voltage bipolar applications," *Journal of Physics D: Applied Physics,* 2021. 54(45). Ion beam implantation is a commonly used doping methodology in realizing p-type and n-type doping in SiC device fabrication. Ion implantation is an energetic process inevitably creating atomic scale intrinsic defects including $V_C$. The carbon vacancy in SiC is thermally stable and persists after annealing at a high temperature of 1800° C. Id.

Defect probes now exists that are used to detect defects in semiconductor wafers. In particular, scanning electron microscopes (SEMs) are now available from industry that can be configured to review defects on wafers in a semiconductor production line (for example, the Hitachi review SEM). These SEMs provide an image of the sub-micron size defect on the wafer, which defect can lead to poor device performance. However, an SEM-based defect probe is not feasible for detecting atomic scale defects like atomic vacancies.

In the article S. I. Maximenko et al, "Cathodoluminescence study of the properties of stacking faults in 4H-SiC homoepitaxial layers." *Appl. Physi. Lett.* 94, 092101 (2009) cathodoluminescence is used to study the stacking faults in 4H-SiC, but not the atomic scale defects like carbon vacancy. The article F. Fabbri et al, "Comparison between cathodolumescence spectroscopy and capacitance transient spectroscopy on Al+ ion implanted 4H-SiC p+/n diodes," *Superlattice and Microstructures,* 45, 383 (2009) discloses a study of the correlation between CL spectra and the Z1/Z2 deep level defects (carbon vacancy). However, the study did not establish a correlation between the carbon vacancy and the reverse bias leakage current, nor suggest the use of CL for monitoring the leakage current.

In the article T. Katsuno et al., "Effects of Surface and Crystalline Defects on Reverse Characteristics of 4H-SiC Junction Barrier Schottky Diodes," *Jpn. J. Appl. Phys.,* 50, 04DP04 (2011) the correlation between the leakage current and the surface defect is revealed. However, it does not reveal a correlation between the leakage current and the bulk deep trap carbon vacancy, nor mention the use of CL for monitoring the carbon vacancy. The article M. L. Megherbi et al., "Analysis of trapping effects on the forward current-voltage characteristics of Al-implanted 4H-SiC p-i-n diodes," *IEEE Trans.* 65, 3371 (2018) reveals the correlation between the carbon vacancy and the forward biased current, but not the reverse biased leakage current.

The article, S. Tumakha et al., "Defect-driven inhomogeneities in Ni/4H-SiC Schottky barriers," *Applied Physics Letters,* vol. 87, 242106 (2005) discloses the use of depth-resolved cathodoluminescence spectroscopy to measure the optical emissions of mid gap states localized at 4H-SiC interfaces. Peaks at 2.2 eV, 2.45 eV and 2.65 eV are observed in CL spectra. The 2.2 and 2.65 eV were ascribed respectively to specific defect complex and polytype inclusions. The 2.45 eV was associated to B-related defects while the 2.65 eV peak was associated with a defect complex, but the exact identity of the defect was not disclosed. The article also reported striking correspondence between deep level defects and electrical transport measurements on a diode-by-diode basis, but did not mention a correlation between reverse biased leakage current and the CL intensity at the 2.62 eV peak.

Despite of the importance of atomic scale defects in influencing device performance, there is not yet a probe available that can be deployed in the device production line for detecting the spatial distribution of atomic scale defects, especially those associated with device leakage current.

SUMMARY OF THE INVENTION

The present invention is directed to a methodology for detecting the spatial distribution of carbon vacancy in SiC wafers via spatial luminescence distribution. The luminescence intensity is associated with the atomic scale defect concentration. The results show the correlation between the luminescence signal intensity and the leakage current of the SiC device, revealing its ability to spot devices with unacceptably large leakage current. This can be done in between manufacturing steps before the entire fabrication process is fully completed.

According to the invention the wafer is scanned with a Japan Electron Optics Laboratory (JEOL) field emission scanning electron microscope (SEM) and the cathodoluminescence (CL) is detected by an attached monochromator to form a CL spatial intensity map of the device. The defects correspond to the regions with high luminescence intensity.

To obtain the CL spectra (i.e. the CL intensity against photon energy), for each of the photon energy levels, the integral CL intensity is summed up for the whole CL spatial mapping. The obtained CL spectra of the samples are characterized by a broad defect emission (DE) peaking at ~2.62 eV. Defect emission peaking at 2.62 eV can be understood as the electron transition from the defect state $E_D$ to the valance band $E_V$ with emission of a photon. Since the photon energy is 2.62 eV and the band gap of 4H-SiC is 3.26 eV, $E_D$ is located at 0.64 eV, which coincides well with the $V_C$ energy state position. The DE seen in the CL spectrum is thus associated with the carbon vacancy. In particular, the CL intensity can be used as a parameter to screen out devices having too high a carbon vacancy, which leads to unacceptable leakage current.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

The foregoing and other objects and advantages of the present invention will become more apparent when considered in connection with the following detailed description and appended drawings in which like designations denote like elements in the various views, and wherein:

FIG. 1A shows an SEM picture of a SiC diode having a low leakage current (low defects), FIG. 1B shows a corresponding CL mapping of the SiC diode having a low leakage current, FIG. 1C shows an SEM picture of a SiC diode having a high leakage current (high defects) and FIG. 1D shows a corresponding CL mapping of the SiC diode having a high leakage current;

FIG. 2 shows graphs of the CL signal intensity versus photon energy (eV) of 10 samples with leakage current Ir from 0.86 µA to 139.00 µA;

FIG. 3A shows electron hole excitation of 4H-SiC by an electron beam of the SEM and FIG. 3B shows the defect emission (DE) result of the transition from the carbon vacancy state (ED) to the valence band EV.

DETAILED DESCRIPTION OF THE INVENTION

Figures 1A, 1B, 1C, 1D:
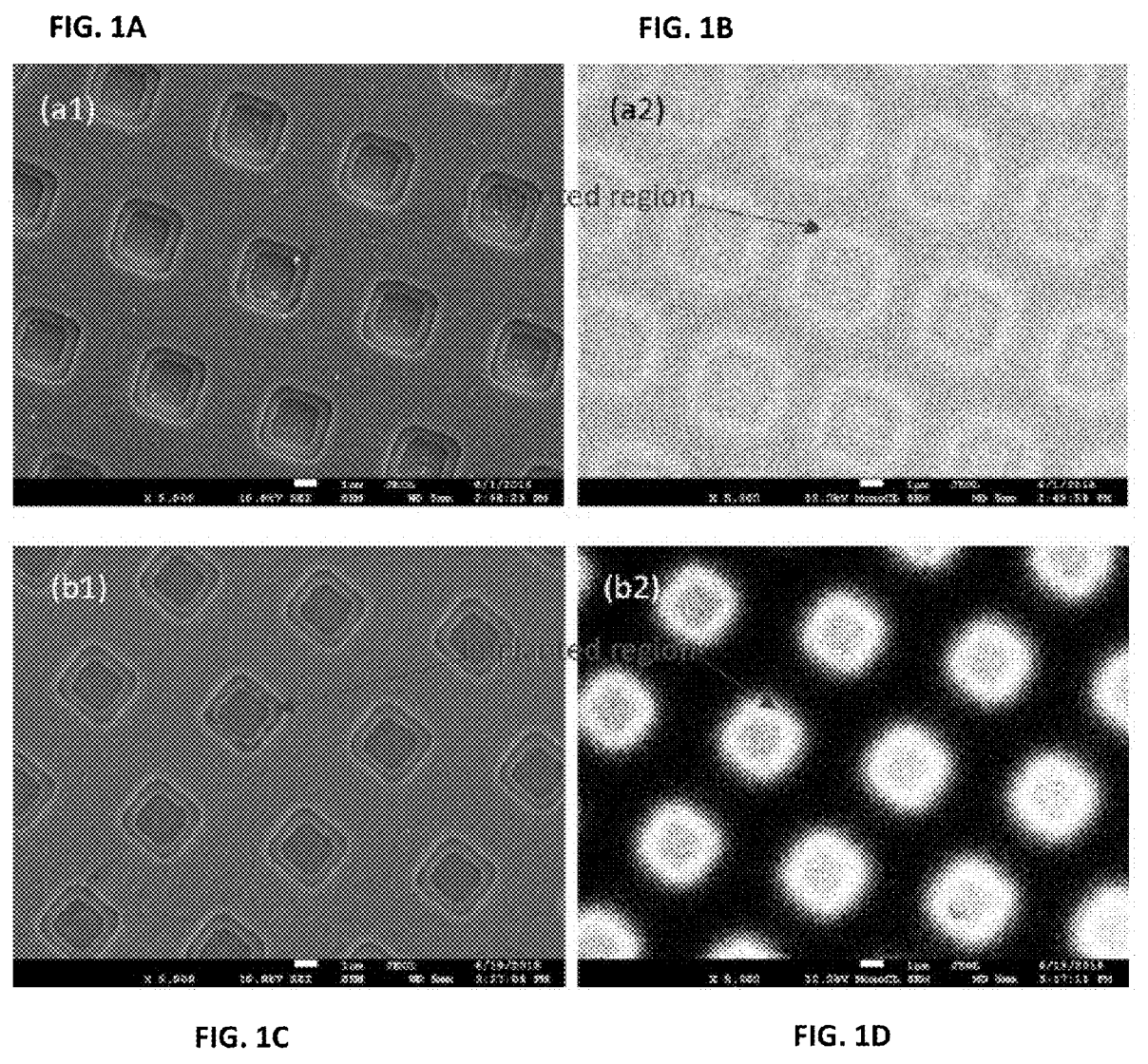
Figure 4:
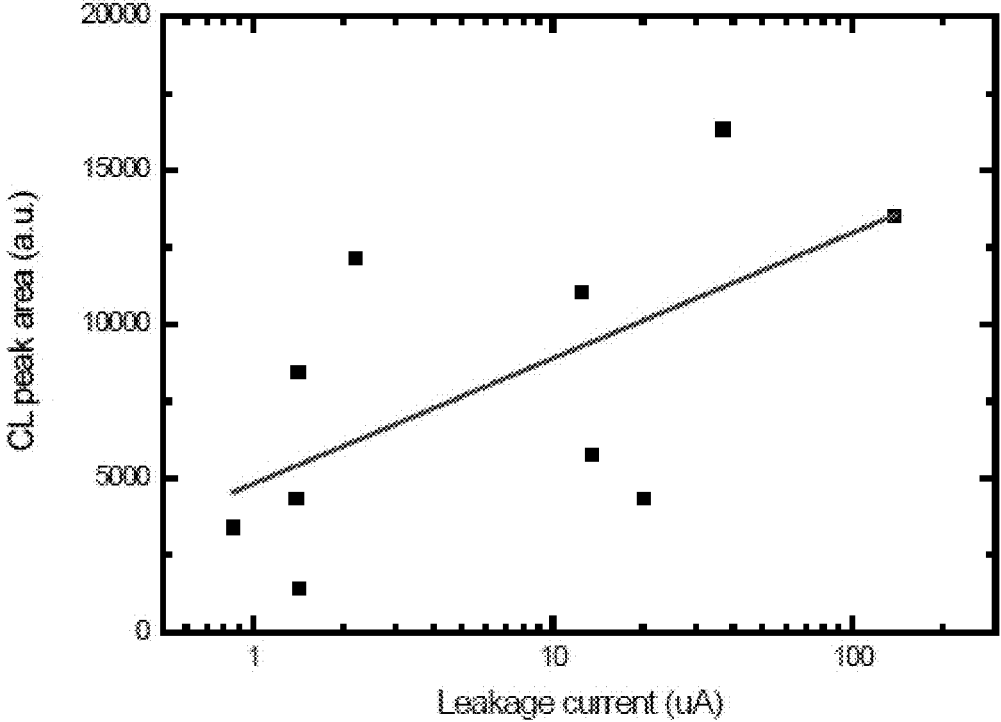
FIG. 4 is a graph of the relationship between leakage current and CL intensity on the peak area of different commercial JBS diodes.

In order to provide proof of the basic concept of the present invention, i.e., that CL intensity can be used as a parameter to screen out devices having too high a carbon vacancy and thus too high a leakage current, a study was carried out on ten 4H-SiC junction barrier diodes (JBS). The leakage currents of each of the diodes was measured by IV measurement. Typical SEM images for two of the devices after de-capsulation are shown in FIGS. 1A and 1C, respectively. They have leakage currents of 1.45 µA (low) and 139 µA (high), respectively, with a reverse bias of –1700 V. The p-type region of each JBS diode was created by Al-ion implantation followed by post-implantation annealing at 1800° C. to activate the Al dopant. The implanted dopant region is illustrated by the dotted line in FIGS. 1A and 1C.

Deep level transient spectroscopy (DLTS) is a probe for detecting electrically active defects having deep level states in the band gap. A DLTS signal called Z1/Z2 located at 0.56 eV below the conduction band was found in all the samples. This deep trap is usually associated with the carbon vacancy. See. Son, N. T., et al., "Negative-U system of carbon vacancy in 4H-SiC," *Phys Rev Lett*, 2012. 109(18): p. 187603; and "Carbon vacancy control in p+-n silicon carbide diodes for high voltage bipolar applications," *Journal of Physics D: Applied Physics*, 2021. 54(45).

The commercial JBS diodes were de-capsulated by wet chemical etching. The sample was etched by immersing in $H_2SO_4/H_2O_2$ for 10 minutes and HF for 10 minutes. After removing the surface electrodes, the sample was cleaned with deionized (DI) water. The sample was then scanned with the JEOL field emission scanning electron microscope (SEM) JSM-7001-F and a cathodoluminescence (CL) study was carried out with the attached monochromator GATAN MonoCL3. FIG. 1B is the corresponding cathodoluminescence (CL) spatial intensity mapping of the SEM image of the device in FIG. 1A, whereas FIG. 1D is the CL spatial intensity mapping of FIG. 1C. The images clearly show that the implanted region correlates with the region having high luminescence intensity in each sample.

To obtain the CL spectra (i.e., the CL intensity against photon energy), the photon energy for each integral CL intensity was summed up for the whole CL spatial mapping. The obtained CL spectra of the ten samples are shown in FIG. 2 with their corresponding leakage current. All of these spectra are characterized by a broad defect emission (DE) peaking at ~2.62 eV.

The origin of this DE is shown in the band diagram of FIG. 3A. FIG. 3A shows the electron-hole excitation by the electron beam of the SEM. Defect emission peaking at 2.62 eV can be understood as the electron transition from the defect state $E_D$ to the valance band $E_V$ with emission of a photon (FIG. 3B). As the photon energy is 2.62 eV and the band gap $E_g$ of 4H-SiC is 3.26 eV, $E_D$ is located at 0.64 eV, which coincides well with the VC energy state position as revealed by DLTS. The DE seen in the CL spectrum is thus associated with the carbon vacancy.

FIG. 4 shows the CL intensity of the DE against the log of the leakage current for the 10 samples, which demonstrates the positive correlation between the CL intensity and the leakage current. This implies that the leakage current increases with increasing carbon vacancy concentration, revealing that the leakage current is dominantly associated with defect assisted tunnelling. See, Grandidier, B., et al., "Defect-assisted tunneling current: A revised interpretation of scanning tunneling spectroscopy measurements," *Applied Physics Letters*, 2000. 76(21): p. 3142-3144; and Mandurrino, M., et al., "Physics-based modeling and experimental implications of trap-assisted tunneling in InGaN/GaN light-emitting diodes," *Physica Status Solidi (a)*, 2015. 212(5): p. 947-953. The integrated DE intensity can thus serve as a performance merit parameter, and it can be used as the monitoring parameter to discriminate devices that will result in poor performance from the production line before the entire fabrication process is complete. The critical CL intensity for discrimination can be obtained from a calibration curve with the desired value of the leakage current.

The above is only the specific implementation mode of the invention and not intended to limit the scope of protection of the invention. Any modifications or substitutes apparent to those skilled in the art shall fall within the scope of protection of the invention. Therefore, the protected scope of the invention shall be subject to the scope of protection of the claims.

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

The invention claimed is:

1. A method of detecting atomic scale defects in SiC semiconductor wafers, comprising the steps of
   scanning the surface of the semiconductor wafers with a field emission scanning electron microscope (SEM) to form an SEM image thereof;

scanning the SEM image with a light detector and mono-chromator to obtain a cathodoluminescence (CL) spatial intensity map of the SEM image;

determining the CL spectra, i.e. the CL intensity against photon energy for each integral CL intensity in the intensity map; and comparing each CL intensity on the intensity map to a threshold, whereby those CL intensities above the threshold are deemed to indicate a spatial distribution of carbon vacancies in the SiC wafers and unacceptable leakage current.

2. The method of detecting atomic scale defects according to claim 1 wherein the detecting occurs on SiC semiconductor wafers in-line during production of semiconductor devices.

3. The method of detecting atomic scale defects according to claim 2 wherein the detection occurs during fabrication of 4H-SiC diodes.

4. The method of detecting atomic scale defects according to claim 1 wherein the step of determining the CL spectra comprises the step of summing the photon energy for each integral CL intensity for the whole CL spatial mapping of the SEM image.

5. The method of detecting atomic scale defects according to claim 1 wherein the threshold or critical CL intensity for discrimination is obtained from a calibration curve based on the desired maximum value of the leakage current.

* * * * *